US006103620A

United States Patent [19]

Kim

[11] Patent Number: 6,103,620

[45] Date of Patent: Aug. 15, 2000

[54] METHOD FOR PRODUCING TITANIUM SILICIDE

[75] Inventor: Young Jung Kim, Ichon-shi, Rep. of Korea

[73] Assignee: Hyundai Electronics Industries Co., Ltd., Ichon-shi, Rep. of Korea

[21] Appl. No.: 08/950,801

[22] Filed: Oct. 15, 1997

[30] Foreign Application Priority Data

Dec. 31, 1996 [KR] Rep. of Korea ...................... 96-79973

[51] Int. Cl.[7] ................................................ H01L 21/4763

[52] U.S. Cl. .......................... 438/649; 438/656; 438/683

[58] Field of Search .................................... 438/683, 682, 438/649, 656

[56] References Cited

U.S. PATENT DOCUMENTS

| | | | |
|---|---|---|---|
| 4,218,291 | 8/1980 | Fukuyama et al. | 204/1 T |
| 5,278,100 | 1/1994 | Doan et al. . | |

*Primary Examiner*—Richard Booth
*Assistant Examiner*—David A. Zarneke
*Attorney, Agent, or Firm*—Jacobson, Price, Holman & Stern, PLLC

[57] ABSTRACT

A method for producing a titanium silicide. Titanium is deposited in a chamber in a reactive sputtering manner while flowing a mixture of argon gas and $SiH_4$ or $Si_2H_6$ into the chamber.

10 Claims, No Drawings

METHOD FOR PRODUCING TITANIUM SILICIDE

BACKGROUND OF THE INVENTION

1. Field of the Invention

The present invention relates, in general, to a method for producing a titanium silicide in a semiconductor device and, more particularly, to a reactive physical deposition method by which a titanium silicide of low specific resistance can be obtained with a significant improvement in productivity and a significant reduction in production cost.

2. Description of the Prior Art

The high integration of semiconductor devices requires conductive wirings to be of low resistance. In the case that a polysilicon layer acts as a word line, the resistance of the word line increases with its length, leading to a decrease in operation speed and an increase in power consumption.

In order to reduce the resistance of such a word line, conventionally, a physical deposition method was performed to deposit titanium, followed by a thermal treatment to form a titanium silicide. If the titanium is too thin, the resulting titanium silicides are highly apt to aggregate each other so that not only is their surface morphology degraded but also a uniform deposition on a substrate is not accomplished. On the other hand, if the titanium is too thickly deposited, surplus Ti after the formation of titanium silicide causes junction leakage. Thus, the titanium should be deposited to an optimal thickness but this is very difficult owing to the unreliable reproductivity of conventional processes. In fact, the physical deposition method is now almost never employed.

In chemical deposition methods, a titanium source and a silicon source are used at the same time to deposit a titanium silicide. Since the titanium source reacts mainly with silicon, the substrate, it is consumed too much. In addition, the chemical deposition methods have another significant problem of being low in process reproductivity.

SUMMARY OF THE INVENTION

Therefore, it is an object of the present invention to overcome the above problems encountered in the prior arts and to provide a method for producing a titanium silicide, with which a low specific resistance can be brought into the titanium silicide without a further thermal treatment.

In accordance with the present invention, the above object could be accomplished by a provision of a method for producing a titanium silicide, which comprises depositing titanium in a chamber in a reactive sputtering manner while flowing a mixture of argon gas and $SiH_4$ or $Si_2H_6$ into the chamber.

When sputtering titanium in a mix atmosphere of argon and $SiH_4$ or $Si_2H_3$ gas to produce $TiSi_x$, a titanium silicide ($TiSi_2$) can be obtained by controlling the flow rate of $SiH_4$ and $Si_2H_6$. A thermal treatment may be employed in order to yield $C_{54}$, a desired titanium silicide.

DETAILED DESCRIPTION OF THE INVENTION

According to the present invention, $TiSi_x$ is formed by sputtering titanium in a chamber into which argon gas and $SiH_4$ or $Si_2H_6$ are flowed together. A titanium silicide can be obtained with the control of the flow rate of $SiH_4$ or $Si_2H_6$. Further, a titanium silicide of $C_{54}$ phase, a crystalline structure with low specific resistance, can be produced by maintaining the temperature of the chamber at 300–550° C.

In this process, the argon gas is usually used at an amount of 10–50 sccm (standard cubic centimeter) while 10–200 sccm for $SiH_4$ or $Si_2H_6$. In the chamber, the mixture gas of argon and $SiH_4$ or $Si_2H_6$ has a pressure of 0.5–10 mTorr in total. The reactive physical deposition of the present invention is carried out at a power of about 500–20,000 W at room temperature to 700° C. with preference to 300–550° C. The titanium silicide thus forms ranges, in thickness, from about 100 to 5,000 Angstrom.

In accordance with the present invention, a thermal treatment subsequent to the reactive sputtering process may be taken in order to more improve the properties of the titanium silicide.

Conventional techniques must take a thermal treatment step to form a titanium silicide of low specific resistance. By contrast, the present invention can bring such a low specific resistance into the titanium silicide without a further thermal treatment.

Therefore, the reproductivity process can be increased by virtue of omitting the thermal treatment step and the production cost can be reduced because of no need of the thermal treatment apparatus. In addition, the titanium silicide of the present invention is deposited with minimal consumption of the silicon, the substrate.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for producing a titanium silicide, which comprises depositing titanium in a chamber in a reactive sputtering manner while flowing a mixture of argon gas and $SiH_4$ or $Si_2H_6$ into the chamber in order to yield a titanium silicide having a crystalline structure of C54 phase without requiring a further heat treatment.

2. A method in accordance with claim 1, wherein said argon is flowed at a rate of about 10–50 sccm.

3. A method in accordance with claim 1, wherein said depositing is carried out at a power of about 500 to 20,000 W.

4. A method in accordance with claim 1, wherein a temperature of said chamber ranges from room temperature to 700° C.

5. A method in accordance with claim 1, wherein said $SiH_4$ or $Si_2H_6$ is flowed at a rate of about 10–200 sccm.

6. A method in accordance with claim 1, wherein said mixture gas has a pressure of about 0.5–10 mTorr in total.

7. A method in accordance with claim 1, wherein said titanium silicide has a thickness of about 100 to 5,000 Angstrom.

8. A method in accordance with claim 1, further comprising a thermal treatment step following the deposition of titanium silicide.

9. A method in accordance with claim 4, wherein said titanium silicide having a crystalline structure of C54 phase is produced while maintaining the temperature of said chamber at 300 to 550° C.

10. A method for producing a titanium silicide, which comprises depositing titanium in a chamber in a reactive sputtering manner while flowing a mixture of argon gas and $SiH_4$ or $Si_2H_6$ into the chamber in order to yield a titanium silicide having a crystalline structure of C54 phase without requiring a further heat treatment, wherein said titanium silicide is formed at a temperature in said chamber of from 300 to 550° C. and a power of about 500 to 20,000 W.

* * * * *